(12) United States Patent
Chen

(10) Patent No.: US 8,368,192 B1
(45) Date of Patent: Feb. 5, 2013

(54) MULTI-CHIP MEMORY PACKAGE WITH A SMALL SUBSTRATE

(75) Inventor: Hui-Chang Chen, Hsinchu (TW)

(73) Assignee: Powertech Technology, Inc., Hsinchu (TW)

( * ) Notice: Subject to any disclaimer, the term of this patent is extended or adjusted under 35 U.S.C. 154(b) by 0 days.

(21) Appl. No.: 13/234,502

(22) Filed: Sep. 16, 2011

(51) Int. Cl.
*H01L 23/495* (2006.01)

(52) U.S. Cl. ......... 257/676; 257/E23.037; 257/E21.499; 438/106; 438/126; 438/127

(58) Field of Classification Search .......... 438/106–127; 257/676, E23.037, E21.499
See application file for complete search history.

(56) References Cited

U.S. PATENT DOCUMENTS

| | | | |
|---|---|---|---|
| 4,946,518 A * | 8/1990 | Spanjer et al. ............. | 148/282 |
| 5,844,306 A * | 12/1998 | Fujita et al. ............. | 257/676 |
| 6,320,251 B1 * | 11/2001 | Glenn ............. | 257/678 |
| 6,847,099 B1 * | 1/2005 | Bancod et al. ............. | 257/666 |
| 6,965,159 B1 | 11/2005 | Miks et al. | |
| 7,094,633 B2 | 8/2006 | Takiar | |
| 7,112,875 B1 * | 9/2006 | Miks et al. ............. | 257/679 |
| 7,224,052 B2 * | 5/2007 | Nishizawa et al. ............. | 257/679 |
| 7,425,755 B2 * | 9/2008 | Liu ............. | 257/666 |
| 7,485,491 B1 * | 2/2009 | Miks et al. ............. | 438/106 |
| 7,488,620 B2 * | 2/2009 | Takiar et al. ............. | 438/113 |
| 7,556,986 B1 * | 7/2009 | Miks et al. ............. | 438/118 |
| 7,560,804 B1 * | 7/2009 | Glenn ............. | 257/666 |
| 7,687,902 B2 * | 3/2010 | Shiraishi et al. ............. | 257/723 |
| 8,097,942 B2 * | 1/2012 | Misumi et al. ............. | 257/691 |
| 8,138,598 B2 * | 3/2012 | Shiraishi et al. ............. | 257/723 |
| 8,169,088 B2 * | 5/2012 | Nguyen ............. | 257/786 |
| 8,223,500 B2 * | 7/2012 | Yamada et al. ............. | 361/737 |
| 2002/0140068 A1 * | 10/2002 | Lee et al. ............. | 257/676 |
| 2003/0159513 A1 * | 8/2003 | Nagahara et al. ............. | 73/514.16 |
| 2003/0222331 A1 * | 12/2003 | Lee et al. ............. | 257/676 |
| 2004/0145041 A1 * | 7/2004 | Terui et al. ............. | 257/691 |
| 2005/0029584 A1 * | 2/2005 | Shiraishi et al. ............. | 257/329 |
| 2007/0164402 A1 * | 7/2007 | Jung et al. ............. | 257/666 |
| 2007/0296069 A1 * | 12/2007 | Terui et al. ............. | 257/676 |
| 2009/0057869 A1 * | 3/2009 | Hebert et al. ............. | 257/691 |
| 2009/0179315 A1 * | 7/2009 | Jereza ............. | 257/676 |
| 2009/0189261 A1 * | 7/2009 | Lim et al. ............. | 257/676 |
| 2009/0236704 A1 * | 9/2009 | Camacho et al. ............. | 257/670 |
| 2010/0133674 A1 * | 6/2010 | Hebert et al. ............. | 257/686 |
| 2010/0155915 A1 * | 6/2010 | Bell et al. ............. | 257/676 |
| 2011/0233746 A1 * | 9/2011 | Liu et al. ............. | 257/676 |
| 2011/0244633 A1 * | 10/2011 | Madrid et al. ............. | 438/122 |
| 2011/0260266 A1 * | 10/2011 | Han et al. ............. | 257/415 |
| 2012/0164794 A1 * | 6/2012 | Xue et al. ............. | 438/123 |

* cited by examiner

*Primary Examiner* — N Drew Richards
*Assistant Examiner* — Ankush Singal
(74) *Attorney, Agent, or Firm* — Muncy, Geissler, Olds & Lowe, PLLC

(57) ABSTRACT

Disclosed is a multi-chip memory package with a small substrate by using a die pad having an opening to substitute the chip-carrying function of a conventional substrate so that substrate dimension can be reduced. A substrate is attached under the die pad. A first chip is disposed on the substrate located inside the opening. A second chip is disposed on the die pad. An encapsulant encapsulates the top surface of the die pad, the top surface of the substrate, the first chip, and the second chip. The dimension of the substrate is smaller than the dimension of the encapsulant. In a preferred embodiment, a plurality of tie bars physically connect to the peripheries of the die pad and extend to the sidewalls of the encapsulant to have a plurality of insulated cut ends exposed from the encapsulant.

13 Claims, 7 Drawing Sheets

MULTI-CHIP MEMORY PACKAGE WITH A SMALL SUBSTRATE

FIELD OF THE INVENTION

The present invention relates to a semiconductor device, and more specifically to a multi-chip memory package with a small substrate.

BACKGROUND OF THE INVENTION

Conventionally, a substrate with the same dimension as a memory card is implemented as a chip carrier in early memory packages such as revealed in U.S. Pat. No. 7,094,633 B2. A plurality of substrates are physically interconnected in a substrate strip, then chips are disposed on the corresponding substrates followed by molding the substrate strip, and finally, the molded substrate strip is singulated into individual memory cards. However, the singluated cut sides of the substrate are exposed from the encapsulant which cause poor moisture resistivity and poor reliability. Moreover, the substrate with the same dimension as the memory card is vulnerable for peeling due to stresses exerted on the peripheries of the memory card.

In order to reduce the packaging cost of memory packages, it has been attempted to replace a substrate by a leadframe as revealed in U.S. Pat. No. 7,488,620 B2 and 6,965,159 B1. A leadframe provides a plurality of leads, a plurality of contact pads, and a plurality of die pads made of metal. However, a leadframe is quite limited in circuitry layout with complicated wire bonding or long bonding wires where RDL may be needed on a chip surface leading to even higher chip fabrication cost. Furthermore, no matter a leadframe or a substrate is implemented as a chip carrier, the cut ends of tie bars of a leadframe or the cut sides of a substrate after singulation would become electrically conductive and exposed to atmosphere leading to ESD issues during packaging processes or end-product implementation.

SUMMARY OF THE INVENTION

The main purpose of the present invention is to provide a multi-chip memory package with a small substrate to reduce substrate cost and to eliminate peeling from exposed cut sides of a conventional substrate.

The second purpose of the present invention is to provide a multi-chip memory package with a small substrate to resolve ESD issues due to singulated metal cut surfaces exposed from the encapsulant of a conventional memory package.

According to the present invention, a multi-chip memory package with a small substrate is revealed, primarily comprising a die pad with an opening, a substrate, a first chip, at least a second chip, and an encapsulant. The substrate is attached to a lower surface of the die pad with a top surface of the substrate exposed from the opening where a plurality of contacting pads are disposed on a bottom surface of the substrate. The first chip is disposed on the top surface of the substrate located inside the opening and the second chip is disposed on an upper surface of the die pad. The encapsulant encapsulates the die pad, the top surface of the substrate, the first chip, and the second chip with the bottom surface of the substrate exposed. Moreover, the dimension of the substrate is smaller than the dimension of the encapsulant where a plurality of tie bars physically connect to the peripheries of the die pad and extend to a plurality of sidewalls of the encapsulant.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
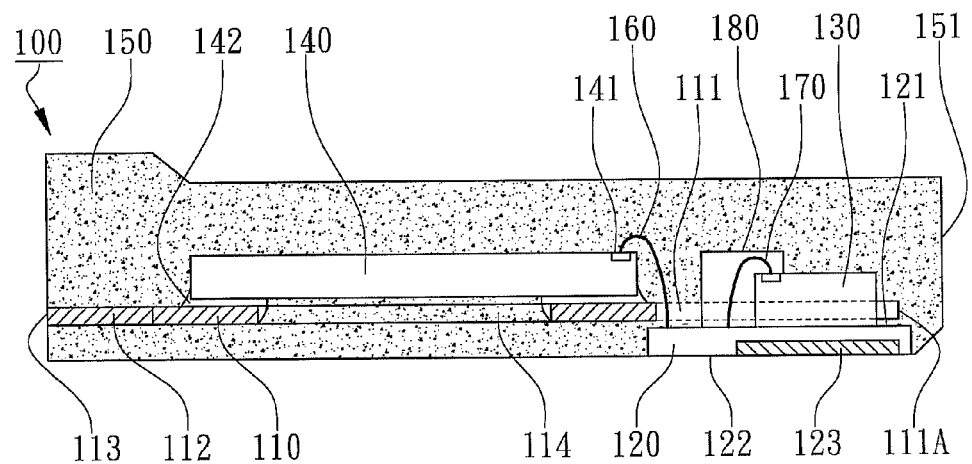
FIG. 1 is a cross-sectional view of a multi-chip memory package with a small substrate according to the preferred embodiment of the present invention.
Figure 2:
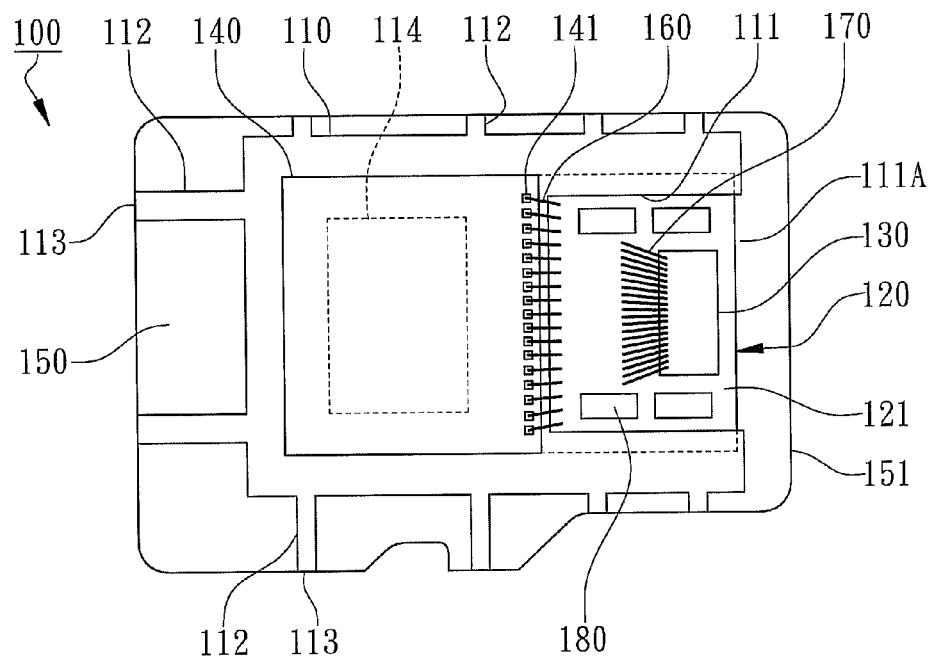
FIG. 2 is a perspective top view seeing through the encapsulant of the multi-chip memory package according to the preferred embodiment of the present invention.
Figure 3:
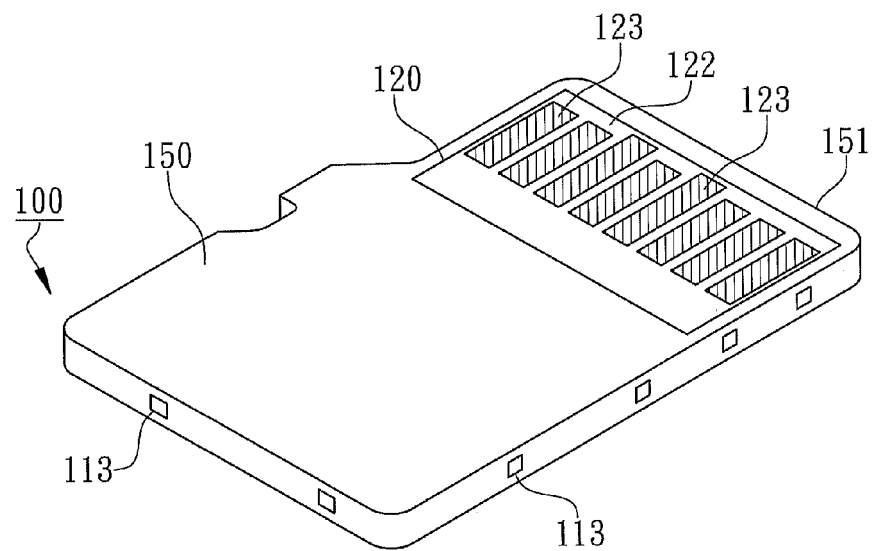
FIG. 3 is a three-dimensional view of the multi-chip memory package illustrating the substrate size on the bottom surface of the encapsulant according to the preferred embodiment of the present invention.

According to the preferred embodiment of the present invention, a multi-chip memory package with a small substrate is revealed where a cross-sectional view is illustrated in FIG. 1, a perspective top view seeing through its encapsulant is illustrated in FIG. 2, and a three-dimensional view illustrating the substrate size on the bottom surface of the encapsulant is illustrated in FIG. 3. The multi-chip memory package 100 primarily comprises a die pad 110 having an opening 111, a substrate 120, a first chip 130, at least a second chip 140, and an encapsulant 150.

Figure 5:
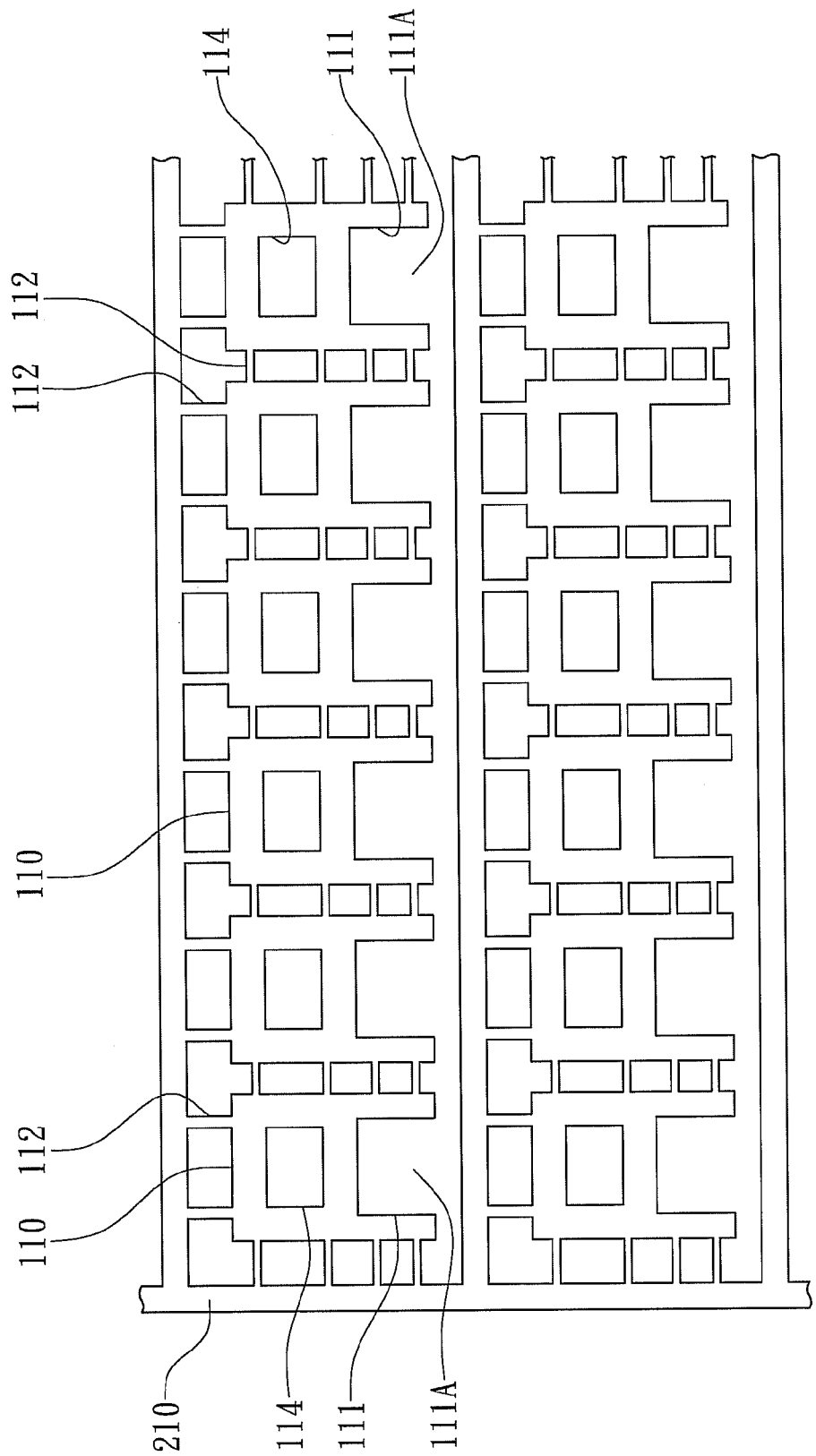
FIG. 5 is a top view of a frame strip including a plurality of die pads for the multi-chip memory package according to the preferred embodiment of the present invention.

The die pad 110 is implemented to carry the substrate 120 and the second chip 140. The die pad 110 can be a dummy pad without any electrical functions where the die pad 110 can be made of metal or dielectric materials but without metal leads of a conventional leadframe. The die pad 110 further has an upper surface and a lower surface. Moreover, a plurality of tie bars 112 physically connect to the peripheries of the die pad 110 and extend to the sidewalls of the encapsulant 150. In the present embodiment, the tie bars 112 are extended to the non-plugging sidewalls of the encapsulant 150 as shown in FIGS. 2 and 3. As shown in FIG. 5, before manufacture processes of the multi-chip memory package 100, the tie bars 112 can physically connect a die pad 110 to the adjacent die pad 110 or dam bars of the frame strip 210 to be a chip carrier which can be completely molded in one single molding process for mass production. Furthermore, preferably, after manufacture processes of the multi-chip memory package 100, the tie bars 112 have a plurality of insulated cut ends 113 exposed from the sidewalls of the encapsulant 150 to resolve ESD issues of a conventional memory package due to the exposed cut ends of metal leads of a leadframe or the exposed singulated cut sides of an equal-size substrate from the encapsulant. In the present embodiment, in order to form the afore described insulated cut ends 113, the die pad 110 and the tie bars 112 are integrally connected and made of parts of a polymer insulated frame made of BT, FR-4, or FR-5 resin with good heat dissipation, good electrical insulation, and good ESD resistance. The insulated supporting frame, for example, is formed by punching or cutting a conventional core layer of the substrate without any circuitry. In a various embodiment, the die pad 110 and the tie bars 112 can are integrally connected and made of parts of a metal leadframe which is electrically conductive so that the cut ends of the tie bars 112 exposed from the sidewalls of the encapsulant 150 are also electrically conductive where the conductivity of the cut ends of the tie bars 112 can be reduced by decreasing the width of the tie bars 112 at the cut ends or by disposing insulating materials on the cut ends to make cut ends insulated. The substrate 120 has a top surface 121 and a bottom surface 122. The substrate 120 is attached to the lower surface of the die pad 110 by thermosetting polymer materials such as epoxy or die-attaching paste to adhere the peripheries of the top surface 121 of the substrate 120 to the lower surface of the die pad 110 around the opening 111. The top surface 121 of the substrate 120 is also exposed from the opening 111 and there are a plurality of contacting pads 123 disposed on the bottom surface 122 of the substrate 120. The contacting pads 123 serve as the external terminals of the multi-chip memory package 100 where the surface finish of the contacting pads 123 may be plated gold. The shapes of the contacting pad 123 can be changed according to the products such as finger-like gold fingers. The major body of the substrate 120 is glass fibers mixed with resin with circuitry electrically connecting the top surface 121 and the bottom surface 122 such as BT or FR-4 printed circuit board or ceramic substrate to electrically connect to the first chip 130, the second chip 140, and the contacting pads 123. The dimension herein of the substrate 120 is smaller than the dimension of the encapsulant 150 to reduce the packaging cost and to avoid the exposure of cut sides of the substrate 120. The "dimension" herein means the appearance observed from top or from bottom. For example, the peripheries of the top surface 121 of the substrate 120 is compared to the peripheries of the top surface of the encapsulant 150 or the peripheries of the bottom surface 122 of the substrate 120 is compared to the peripheries of the bottom surface of the encapsulant 150. In the present embodiment, the dimension of the substrate 120 is smaller than half of the dimension of the encapsulant 150, i.e., the area of the bottom surface 122 of the substrate 120 is not greater than half of the area of the bottom surface of the encapsulant 150.

The first chip 130 is disposed on the top surface 121 of the substrate 120 located inside the opening 111 by either flip-chip bonding or by conventional die-attaching. In the present embodiment, the first chip 130 is electrically connected to the substrate 120 by a plurality of bonding wires 170 and further to the contacting pads 123. In the present embodiment, the first chip 130 is a controller chip. In a more specific embodiment, the multi-chip memory package 100 further comprises a plurality of passive components 180 such as resistors, inductors, or capacitors disposed on the top surface 121 of the substrate 120 located inside the opening 111.

The second chip 140 is attached to the upper surface of the die pad 110 by a die-attaching material 142. During packaging processes, the pre-cut substrate 120 with an appropriate dimension is attached to the die pad 110 followed by attaching the first chip 130 and the second chip 140, however, the sequence and numbers of the chips are not limited. In the present embodiment, the second chip 140 can be disposed without covering the opening 111. After the dispositions of the first chip 130 and the second chip 140, the first chip 130 and the second chip 140 are electrically connected to the substrate 120 during the same wire bonding process. The second chip 140 can be a single die or multiple stacked dice. In the present embodiment, the second chip 140 can be a memory chip such as NAND flash chip. In a more specific embodiment, the multi-chip memory package 100 further comprises a plurality of bonding wires 160 to electrically connect the bonding pads 141 of the second chip 140 to the top surface 121 of the substrate 120 so that the die pad 110 and the related connected frame do not need leads for electrical conduction. Furthermore, in a preferred embodiment, the die pad 110 has a slot 114 aligned to a back surface of the second chip 140 to enhance the encapsulation of the second chip 140 by the encapsulant 150 and to enhance the heat dissipation of the second chip 140 and to be bleeding accommodating area of the die-attaching material 142 of the second chip 140 to reduce the thickness of the die-attaching material 142 after curing.

The encapsulant 150 encapsulates the die pad 110, the top surface 121 of the substrate 120, the first chip 130, and the second chip 140 with the bottom surface 122 of the substrate 120 exposed. The encapsulant 150 is a molding compound containing thermo-setting epoxy, organic filler, dyes, etc. In the present embodiment, the encapsulant 150 has an appearance of a memory card such as micro SD card as shown in FIG. 2 and FIG. 3. In different embodiments, the encapsulant 150 may has an appearance of semiconductor memory products such as mini SD or eMMC devices. The contacting pads 123 are exposed from the bottom surface of the encapsulant 150 adjacent to the plugging side 151 of the encapsulant 150 where the rest of the sidewalls of the encapsulant 150 are non-plugging sides. Preferably, the opening 111 of the die pad 110 has a gap 111A facing toward the plugging side 151 of the encapsulant 150 so that the first chip 130 is close to the plugging side 151 to shorten the distances to the contacting pads 123 and to spare more space in the encapsulant 150 to accommodate more of the second chip 150.

Therefore, the bottom surface 122 of the substrate 120 and the bottom surface of the encapsulant 150 are coplanar with the cut sides of the substrate 120 encapsulated by the encapsulant 150 so that the substrate 120 has no cut sides exposed from the encapsulant neither at the plugging side 151 nor at the non-plugging sides to have better moisture resistance and to eliminate substrate peeling issues. Therefore, the multi-chip memory package 100 as revealed in the present invention can reduce the packaging cost and eliminate peeling issues of the exposed cut sides of conventional substrate.

As shown from FIG. 4A to FIG. 4E, the manufacture processes of the multi-chip memory package 100 are further described in detail as follows.

Figure 4A:
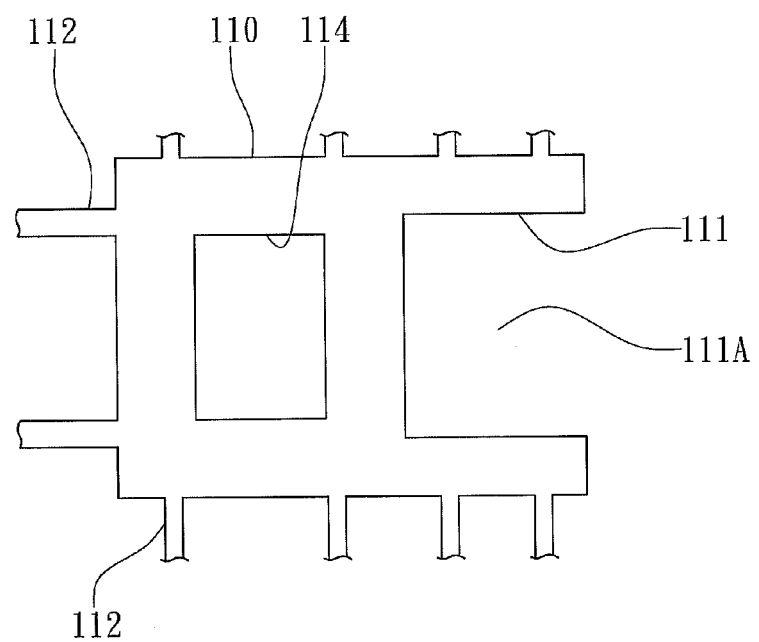
FIGS. 4A to 4E are top views of components of the multi-chip memory package during manufacture processes according to the preferred embodiment of the present invention.
Figure 4B:
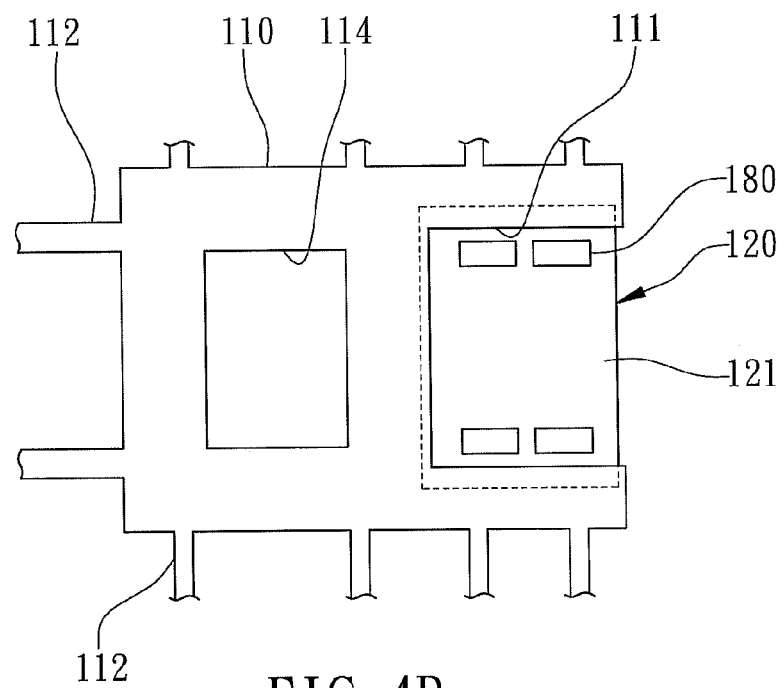
Figure 4C:
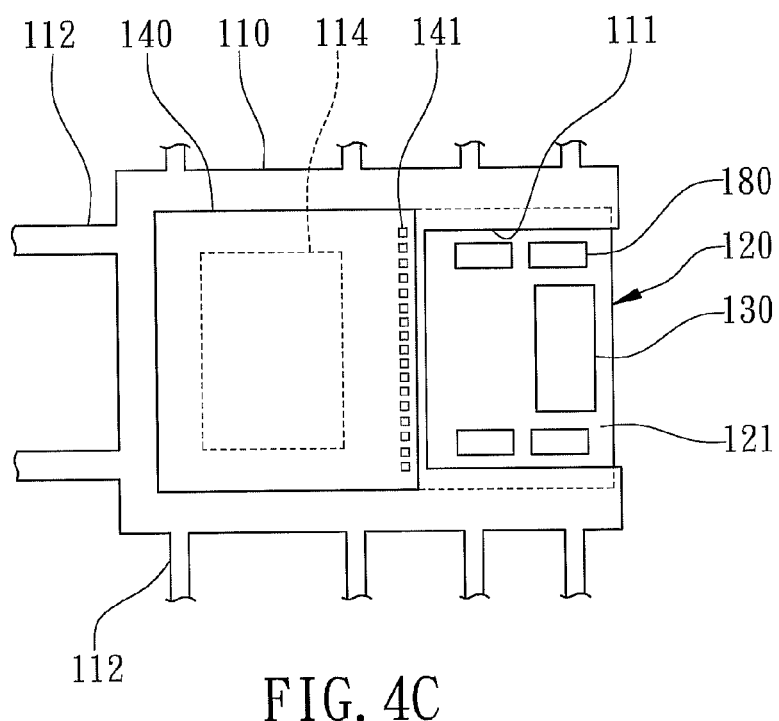
Figure 4D:
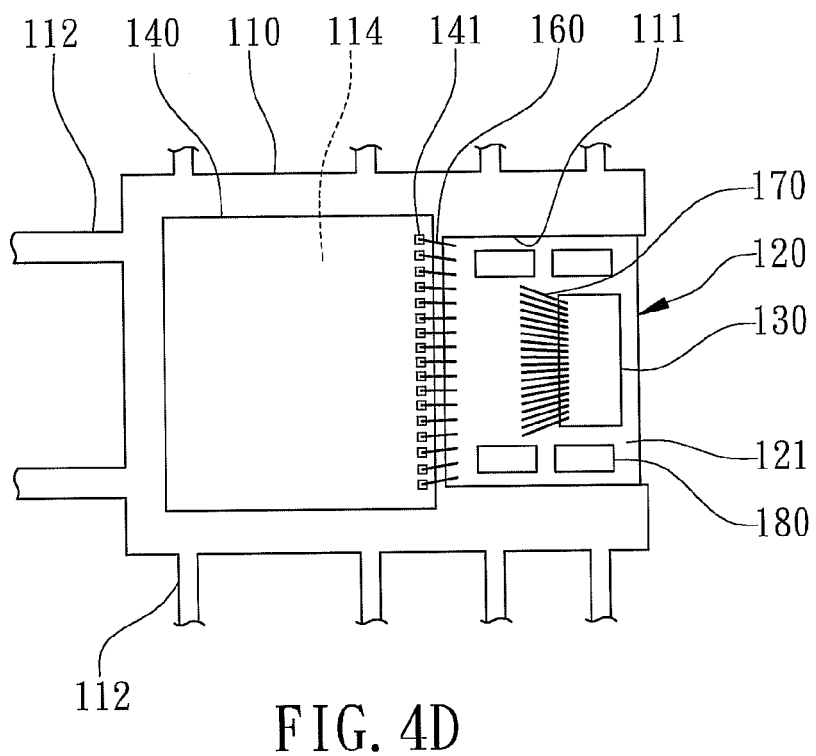
Figure 4E:
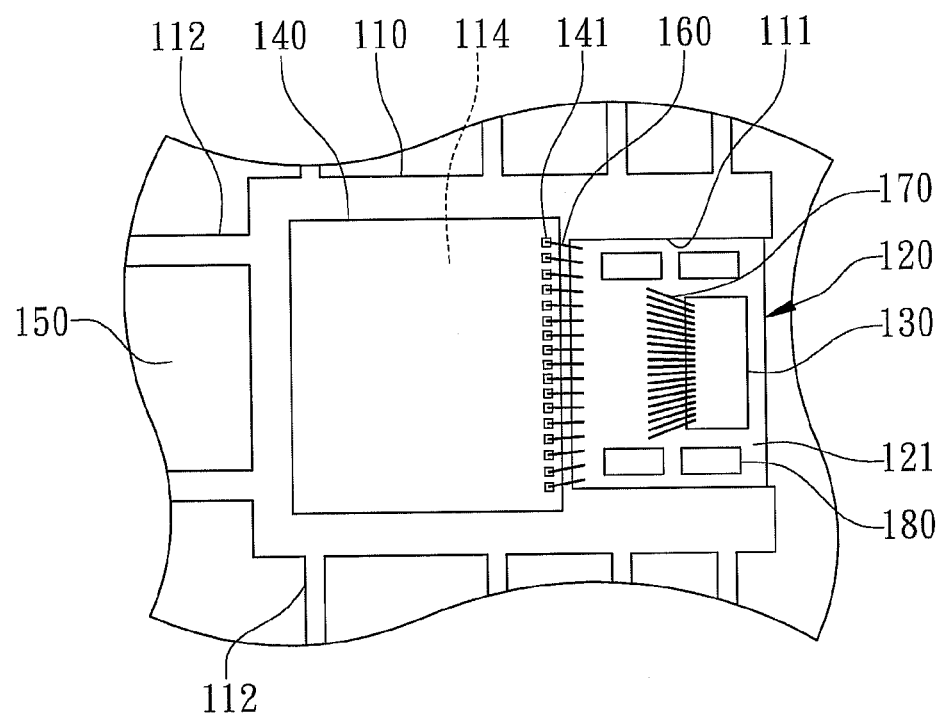
Figure 6:
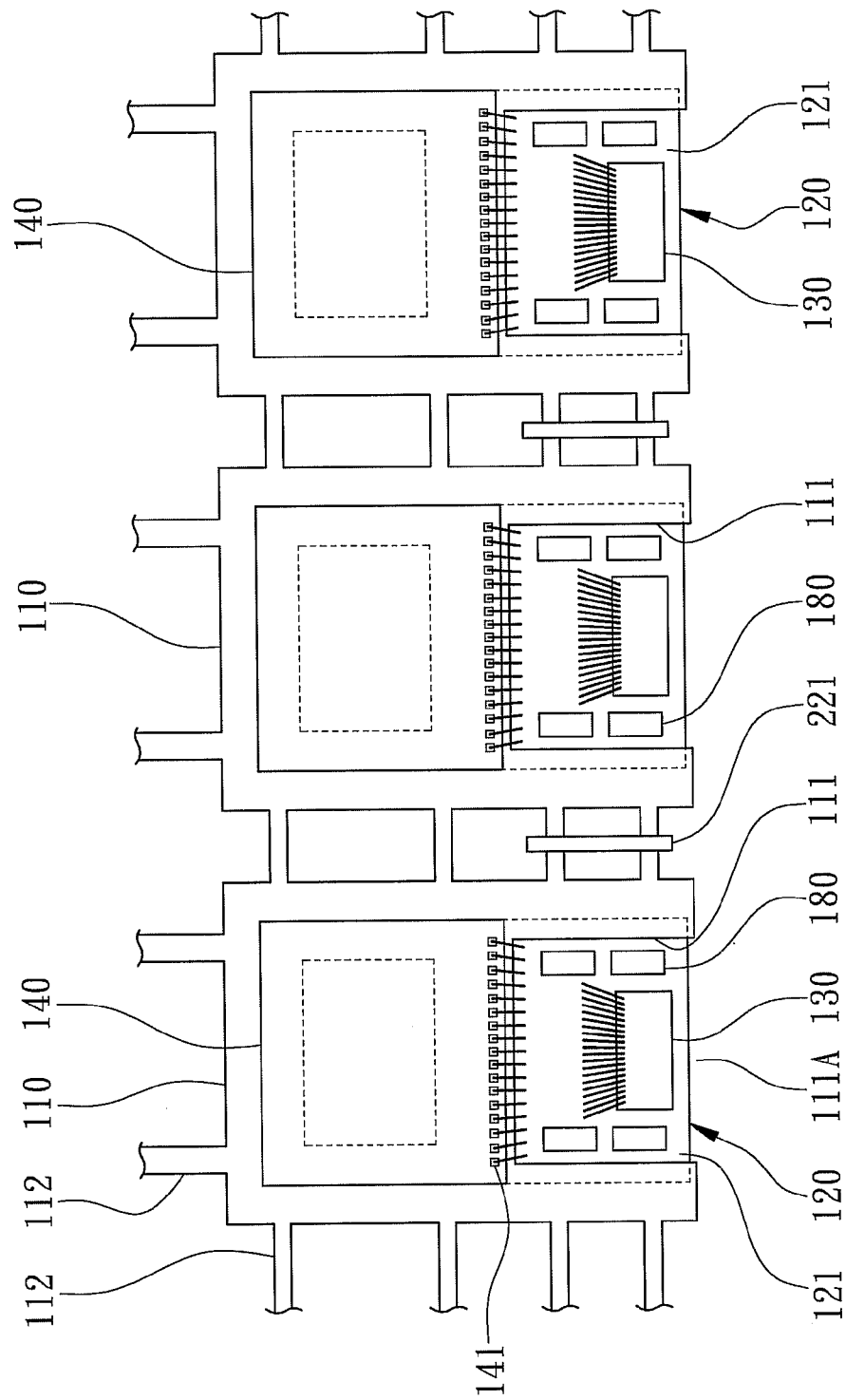
FIG. 6 is a top view of the frame strip with a first chip and a second chip disposed on it before molding during the manufacture processes of the multi-chip memory package according to the preferred embodiment of the present invention.
Figure 7:
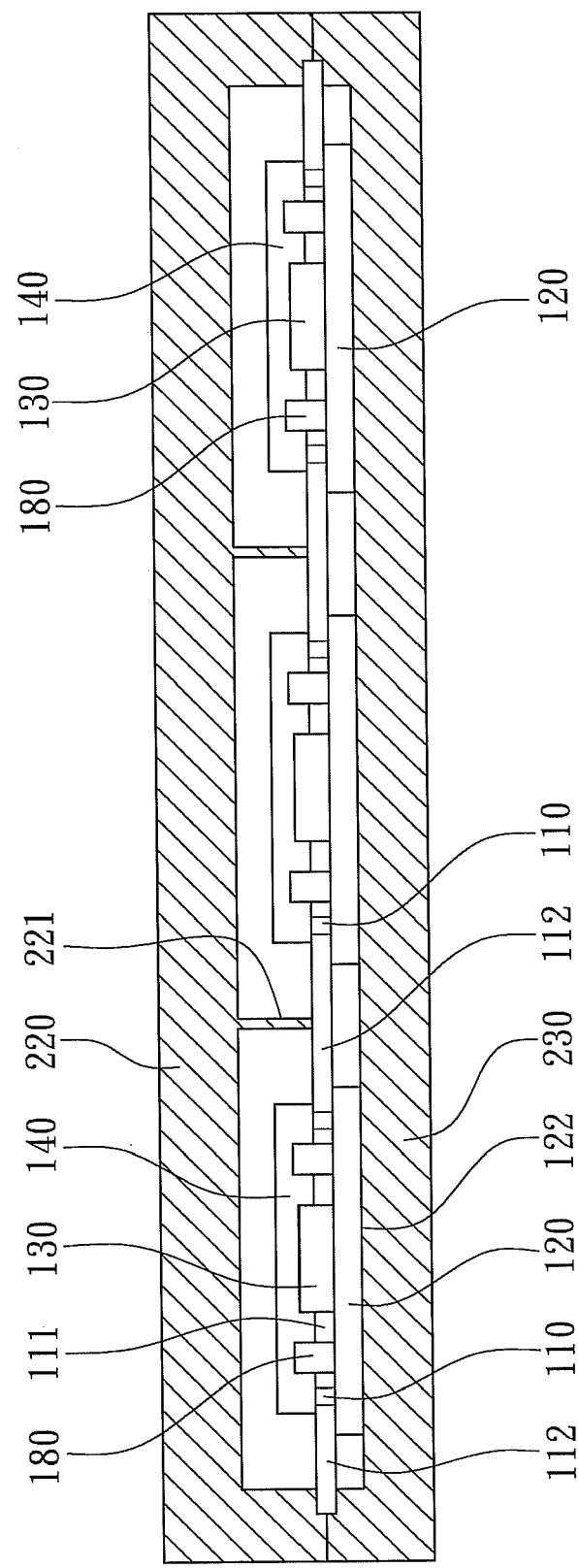
FIG. 7 is a cross-sectional view of the frame strip in a mold chase when molding according to the first embodiment of the present invention.

Firstly, as shown in FIG. 4A, the die pad 110 with the connected tie bars 112 are provided where the die pad 110 has an opening 111. In a preferred embodiment, the die pad 110 further has a slot 114. As shown in FIG. 5, the tie bars 112 physically connect each die pad 110 to the adjacent die pads 110 or to the frame 210 to compose a frame strip. Then, as shown in FIG. 4B, the substrate 120 with the contacting fingers 123 and the pre-disposed passive components 180 is attached to the lower surface of the die pad 110 with the top surface 121 of the substrate 120 exposed from the opening 111 of the die pad 110. Then, as shown in FIG. 4C, the chips 130 and 140 are attached where the first chip 130 is attached to the top surface 121 of the substrate 120 located inside the opening 111 and the second chip 140 is attached on the die pad 110 without covering the opening 111 and aligned to the slot 114. Then, as shown in FIG. 4D, the chips 130 and 140 are electrically connected to the substrate 120 where the bonding wires 160 electrically connect the second chip 140 to the substrate 120 and the bonding wires 170 electrically connect the first chip 130 to the substrate 120 respectively. Then, as shown in FIG. 4E, the encapsulant 150 is formed by molding processes to encapsulate the first chip 130, the second chip 140, the top surface 121 and the sides of the substrate 120 without encapsulating the bottom surface 122 of the substrate 120 and the contacting fingers 123. As shown in FIG. 6 and FIG. 7, during the pre-process of molding processes, the afore described frame strip is clamped between a top mold 220 and a bottom mold 230 where the first chip 130, the second chip 140, and the substrate 120 are accommodated inside the mold cavity between the top mold 220 and a bottom mold 230 to form the encapsulant 150. Preferably, parts of the tie bars 112 connected to the adjacent die pads 110 can be clamped by a fixing bar 221 located on the scribe lines so that the bottom surface 122 of the substrate 120 is closely stick to the bottom mold 230 to avoid bleeding from the bottom surface 122 during molding processes to reduce shaking of the tie bars 112 by the mold flow without causing the contamination of the contacting pads 123. The fixing bars 221 can be parts of the top mold 220 or an extra component.

Finally, singulation and routing processes are followed to form the multi-chip memory package 100 as shown in FIG. 1, FIG. 2, and FIG. 3 to achieve a flat surface without burrs and to reduce packaging cost. Moreover, the insulated cut ends 113 are formed simultaneously during singulation processes.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:
1. A multi-chip memory package comprising:
   a die pad having an upper surface, a lower surface and an opening;
   a substrate having a top surface attached to the lower surface of the die pad exposed from the opening and a bottom surface with a plurality of contacting pads disposed on the bottom surface;
   a first chip disposed on the top surface of the substrate located inside the opening;
   at least a second chip disposed on the upper surface of the die pad; and
   an encapsulant encapsulating the die pad, the top surface of the substrate, the first chip, and the second chip with the bottom surface of the substrate exposed; wherein the dimension of the substrate is smaller than the dimension of the encapsulant and there are a plurality of tie bars physically connecting to a plurality of peripheries of the die pad and extending to a plurality of sidewalls of the encapsulant.

2. The multi-chip memory package as claimed in claim 1, wherein the tie bars have a plurality of insulated cut ends exposed from the sidewalls of the encapsulant.

3. The multi-chip memory package as claimed in claim 1, wherein the die pad and the tie bars are integrally connected and made of parts of a metal leadframe.

4. The multi-chip memory package as claimed in claim 1, further comprising a plurality of bonding wires electrically connecting the second chip to the top surface of the substrate.

5. The multi-chip memory package as claimed in claim 1, wherein the encapsulant has an appearance of a Micro SD card.

6. The multi-chip memory package as claimed in claim 1, wherein the dimension of the substrate is smaller than half of the dimension of the encapsulant.

7. The multi-chip memory package as claimed in claim 1, wherein the opening has a gap facing toward a plugging side of the encapsulant.

8. The multi-chip memory package as claimed in claim 1, wherein the disposed second chip does not cover the opening.

9. The multi-chip memory package as claimed in claim 1, wherein the first chip is a controller chip and the second chip is a memory chip.

10. The multi-chip memory package as claimed in claim 2, wherein the die pad is a dummy pad without electrical functions.

11. The multi-chip memory package as claimed in claim 10, wherein the die pad and the tie bars are integrally connected and made of parts of a polymer insulated frame.

12. The multi-chip memory package as claimed in claim 8, wherein the die pad has a slot aligned to a back surface of the second chip.

13. The multi-chip memory package as claimed in claim 9, further comprising a plurality of passive components disposed on the top surface of the substrate located inside the opening.

* * * * *